United States Patent [19]

Williams

[11] 3,953,096

[45] Apr. 27, 1976

[54] FREE STANDING MOTHER-DAUGHTER PRINTED CIRCUIT BOARD CONTACT ARRANGEMENT

[75] Inventor: Benjamin Charles Williams, Harrisburg, Pa.

[73] Assignee: AMP Incorporated, Harrisburg, Pa.

[22] Filed: Aug. 6, 1975

[21] Appl. No.: 602,344

Related U.S. Application Data

[63] Continuation of Ser. No. 429,452, Dec. 28, 1973, abandoned.

[52] U.S. Cl. .................................. 339/17 L; 339/65; 339/176 MP; 339/221 R; 339/258 P; 339/276 SF

[51] Int. Cl.$^2$ .......................................... H05K 1/07

[58] Field of Search ............ 339/17 R, 17 C, 17 CF, 339/17 LC, 17 LM, 17 M, 65, 75 MP, 176 MF, 176 MP, 220, 221, 258 R, 258 P, 276 SF

[56] References Cited

UNITED STATES PATENTS

| | | | |
|---|---|---|---|
| 3,158,421 | 11/1964 | Hasenauer | 339/176 MF |
| 3,231,848 | 1/1966 | Ruehlemann | 339/176 MP |
| 3,617,980 | 11/1971 | Alkire | 339/17 R |
| 3,670,290 | 6/1972 | Angele et al. | 339/75 MP |
| 3,673,551 | 6/1972 | McDonough | 339/17 R |
| 3,764,955 | 10/1973 | Ward | 339/65 |
| 3,818,423 | 6/1974 | McDonough | 339/258 P |

OTHER PUBLICATIONS

Amphenol-Borg Electronics Corp; "Objectivity"; Nov. 1963 Magazine Ad.

*Primary Examiner*—Joseph H. McGlynn
*Assistant Examiner*—Craig R. Feinberg
*Attorney, Agent, or Firm*—William J. Keating; Donald W. Phillion

[57] ABSTRACT

A free standing all metal contact, which, when mounted on a first board with other similar contacts, all in a straight line, will mechanically receive and hold, and make electrical contact with a second circuit board. Each contact has U-shaped configuration with the two legs of the U having a width which is normal to the plane of the U. The edges of each of the two legs are bent back in a direction away from the other leg to form an I beam type cross-sectional configuration to provide structural strength. Two of the bent back edges which are diagonally positioned are extended beyond the closed end of the U to form a pair of posts which fit into mating holes in the first circuit board to securely mount the contact thereon. The free end of one of the legs is bent downwardly into the U and towards the other leg to provide a spring-like gripping effect upon the edge of the second board when it is inserted into said U.

3 Claims, 2 Drawing Figures

FREE STANDING MOTHER-DAUGHTER PRINTED CIRCUIT BOARD CONTACT ARRANGEMENT

This application is a continuation of my prior application Ser. No. 429,452, filed Dec. 28, 1973, for "Free Standing Mother-Daughter Printed Circuit Board Contact Arrangement" by Benjamin Charles Williams.

BACKGROUND OF THE INVENTION

This invention relates generally to electrical connectors for connecting a first printed circuit board, commonly known as the daughter board, to a second printed circuit board, commonly known as a mother board, and more specifically the invention relates to a simplified, all metal board-to-board connector arrangement which requires no plastic housing and which is easily installed by hand with the aid of a carrier strip which is inherently provided in the manufacture of the connector.

There are many different types of connectors in use today which are constructed to connect a first circuit board to a second circuit board. Depending upon various parameters, such as the particular type circuit boards involved, the particular environment in which the circuit boards must function, and upon individual specifications of the customer, such board-to-board connectors have widely varying characteristics and design features. For example, some board-to-board connectors are comprised of two separate plastic housings, one of which has a first set of contacts which fit into a first board and the other of which has a second set of contacts which fit into a second board. The two housings each have second sets of contacts which mate together so that the two boards are in fact connected together through the two piece connector.

Other board-to-board connectors employ a single plastic housing into which a row of connectors are embedded during the molding of the housing. Such contacts within the housing usually have a male portion and a female portion, with the male portion constructed to fit into one circuit board and the female portion constructed to recieve the edge of a second circuit board.

In other type board-to-board connectors the connectors are first secured within one of the boards and then a plastic housing is snapped over the connectors in order to provide protection and support for the connectors and also to form a slot into which the edge of a second circuit board can be inserted to make contact with the contacts secured within the first board.

There are many applications for board-to-board connectors in which no plastic housing whatever is needed, and in which the installation of the connectors can be made easily and inexpensively without the aid of expensive application tooling, and yet which have sufficient mechanical strength to effectively hold a mother and a daughter board together.

BRIEF STATEMENT OF THE INVENTION

It is a primary object of the present invention to provide a board-to-board connector requiring no plastic housing.

It is a second purpose of the invention to provide a simple and inexpensive board-to-board connector which can be easily installed in a circuit board without the aid of expensive applicator tooling and which requires no plastic housing.

A third purpose of the invention is an inexpensive and reliable all metal connector, the individual contacts of which are held together by a common carrier strip to facilitate quick manual installation into a circuit board.

A fourth purpose of the invention is an all metal connector comprised of a plurality of individual contacts which can be easily installed in a circuit board by means of a removable carrier strip and in which each of said connectors is constructed to mechanically grip the edge of a second circuit board to mechanically hold the two boards together as well as to provide good electrical connection between the two circuit boards.

In accordance with the invention there is provided a plurality of generally U-shaped contacts with the end of one leg of the U being attached to a carrier strip and with the free end of the other leg of the U being bent inwardly and downwardly toward said first leg of the U so that the row of contacts provide a slot-like arrangement formed by the inner side of the first leg and the bent over portion of the second leg of each of the individual contacts.

To give structural strength to the contact, both edges of each leg of the U-shaped contact are bent back about 90° along a line parallel to the longitudinal axis of the leg and away from the opposing leg so as to provide in each leg a cross-sectional area having a configuration something in the nature of an I beam.

On both legs of the U one of the bent-back portions along the edge of the leg extend beyond the closed end of the U to form two posts which are inserted in holes prepared therefore in the printed circuit board. Such extensions of the bent-back portions of the legs of the U not only provide a means of mechanically mounting the contact upon a printed circuit board but also provide means for making electrical contact with both sides of the printed circuit board. Both the mechanical securing of the contacts to the board as well as the electrical contact made with the board is redundant in that two of such extensions of the legs of the U extend through holes in the board and can be soldered therein by appropriate soldering means, as for example, wave soldering.

BRIEF STATEMENT OF THE FIGURES

The above-mentioned and other features of the invention will be more fully understood from the following detailed description thereof when read in conjunction with the drawings in which:

FIG. 1 is a perspective view of the invention showing two of such contacts installed in a printed circuit board with the carrier strip still attached thereto; and FIG. 2 is a plan view of a printed circuit board showing the locations of the holes in said printed circuit board for receiving the two legs of each of the U-shaped contacts of FIG. 1.

DETAILED DESCRIPTION OF THE INVENTION

Figure 1:
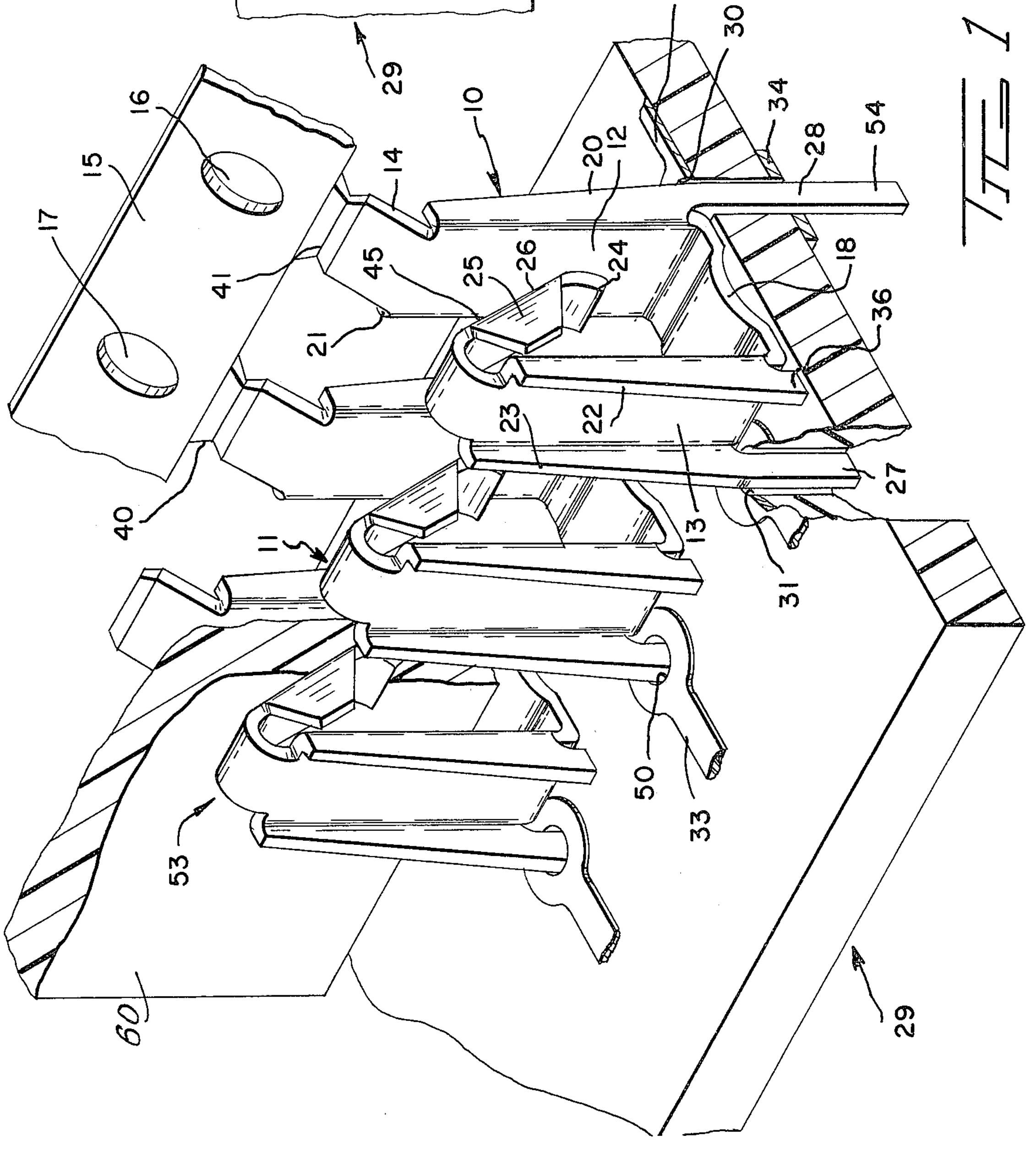

Referring now to FIG. 1 the three U-shaped contacts 10, 11 and 53 are shown mounted upon a circuit board 29. The carrier strip 15, which holds the three contacts 10, 11 and 53 together in a predetermined spatial relationship, is also shown in FIG. 1. It is understood that the carrier 15 is usually broken off at the score lines 40 and 41 after the contacts 10, 11 and 53 are mounted upon the board 29.

It is also to be understood that while only three such contacts 10, 11 and 53 are shown mounted in circuit board 29, many such contacts can, in fact, be simultaneously mounted on the circuit board. Specifically, the receiving circuit board is prepared to receive a given number of contacts by drilling holes therein, such as the holes 31 and 30, shown in FIG. 2, for each contact. Then a portion of the carrier strip 15 is cut so as to contain the desired number of contacts, which are then mounted in the printed circuit board with the aid of the still attached carrier strip 15.

Each of the contacts, such as contacts 10, 11 and 53 are the same. Accordingly, only contact 10 will be described in detail.

Contact 10 can be seen to be generally U-shaped in nature with two main legs 12 and 13, and a transverse connecting portion 18 connecting said two main legs together at the closed end of the U.

One of the two legs 12 has a portion 14 which is connected to carrier strip 15 through a scored section 41 which, as mentioned above, is utilized later to break off the carrier strip 15 from the contacts.

The other leg 13 of the U-shaped contact has its free end 26 bent over and towards the other leg 12. The bent over portion 26 is terminated at tip 24 by being bent back slightly toward the leg 13 so as to permit easy entry and withdrawal of a second circuit board (60) into and from between said bent-over portion 26 and the inner surface of the other leg 12.

To provide structural strength, each of the two legs 12 and 13 have their longitudinal edges bent in a direction away from each other. More specifically the leg 13 has its longitudinal edges 22 and 23 bent backwards away from the leg 12 in such a manner that bent edges 22 and 23 form a flange type feature to provide the leg 13 with the cross-sectional area somewhat similar to that of an I-beam, thereby providing structural strength to the leg 13.

Similarly, the leg 12 has its two longitudinal edges 20 and 21 bent backwards away from the other leg 13 to provide a similar I-beam type structure.

The bent-over tip portion 26 of leg 13 also has its edges 25 bent-over substantially at right angles to the main outer surface 45 of the bent-over portion 26 to add structural strength thereto.

One of the flanged edges 23 of leg 13 extends downwardly beyond the closed end of the U to form a post-like element 27 which extends through a hole 31 in circuit board 29.

Similarly, one of the flange portions 20 of the other leg 12 of contact 10 extends down below the closed end 18 of contact 10 to form a post-like element 28 which extends through a second hole 30 in circuit board 29. It is to be noted that apertures 30 and 31 are positioned at diagonal corners of contact 10 to provide for the greatest mounting stability and the greatest strength of contact 10 on the surface of the circuit board 29.

Each of the two post-like elements 27 and 28 can be soldered to one or both sides of the circuit board 29. For example, leg 28 is being shown as being soldered to a metallic circuit pad 48 on the upper side of printed circuit board 29 and to a circuit pad 34 on the lower side of printed circuit board 29. Also, if desired, the leg 28 (or the leg 27) can be extended through and beyond the board 29 to form a post 54 to which an additional connection, such as a wire wrap, can be made.

The closed portion 18 of the U-shaped contact 10 is arched upwardly in the middle, i.e., portion 18 is concave with respect to the upper surface of circuit board 29 to prevent rocking of contact 10 thereon.

It is also to be noted that the three contacts 11, 10 and 53 as well as other contacts which might be connected to the carrier strip 15, can be arranged in a straight line so that a second printed circuit board (60) can be inserted into the gaps between the two legs of the contact. More specifically, the edge of the second circuit board is inserted between the inner surface of leg 12 of contact 10 and the inner surface 45 of the bent-over portion 26 of the other leg 13 of contact 10. It is apparent that a plurality of such contacts arranged in a row form, what is, in effect, a slot into which the edge of the second printed circuit board is inserted. Appropriate contacts, usually plated on circuit paths, are provided on the second printed circuit board to electrically mate with the individual contacts such as contacts 10, 11 and 53.

Figure 2:
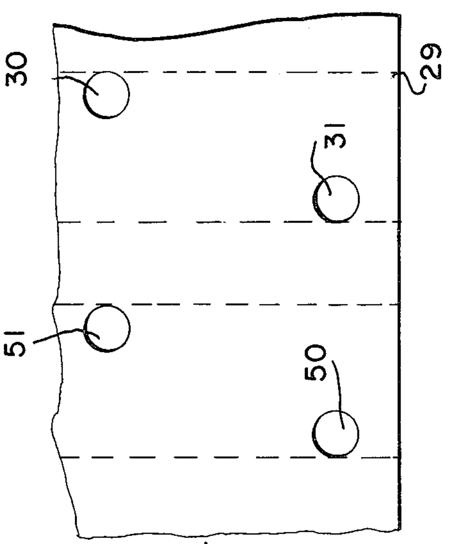

The plan view of a portion of the circuit board 29, as shown in FIG. 2, is provided only to show with more clarity the location of the holes provided therein to receive the individual contacts. More specifically, the holes 31 and 30 of FIG. 2 receive the two legs of contact 10 of FIG. 1, and holes 50 and 51 receive the two legs of contact 11.

Referring again to the bent-over portions of one of the legs of the U-shaped contacts, such as bent-over portion 26 of contact 10, it is to be noted that such bent-over portion 26 provides a spring-like force effect on the edge of a circuit board inserted therein. Such spring-like force effect will maintain a constant pressure against the contacts on the edge of the printed circuit board, and also will function to provide an anti-stress feature in that if the second printed circuit board (60) is accidentally moved from its normal right angle position to the mother board 29, the element 26 will give somewhat, within its elastic limits, to prevent damage being done either to the contacts, such as contacts 10, 11 or 53, or to the printed circuit contact pads on the daughter board (60).

It is to be understood that the form of the invention shown and described herein is but a preferred embodiment thereof and that various modifications can be made in the details of design, such as proportion and cross-sectional configuration of the legs of the contacts, without departing from the spirit and scope of the invention.

What is claimed is:

1. A free standing contact for mounting in a first board, and which, when used with similar contacts arranged along a line, forms an elongated slot-like arrangement for receiving the edge of a second board for making a series of electrical connections therewith, and comprising:

a U-shaped portion having a first and second leg portions with surfacing each other, and a transverse portion joining together one end of said first and second leg portions;

the free end of said first leg portion being bent over and downwardly into the U configuration and at an angle towards said second leg portion;

the free end of said second leg portion being bent outwardly from said first leg to provide a flared opening for said second board;

at least one section of at least one edge of each of said first and second leg portions being bent back in a direction away from the facing surface of the opposite leg portion to form the cross-sectional areas of said first and second leg portions to include generally L-shaped configurations;

a first pair of said bent-back edges diagonally positioned with respect to each other on said first and second legs, extending continuously beyond the said transverse portion to form post-like terminals for insertion into mating holes in said first board;

a second pair of said bent-back edges diagonally positioned with respect to each other on said first and second legs, terminating upon said first board;

at least one edge of the bent over free end of said first leg portion being bent back and away from the facing surface of said opposite leg.

2. A free-standing contact in accordance with claim 1 in which:

the tip of said bent-over portion of said first leg portion is bent back diagonally towards said facing surface of said first leg portion.

3. A plurality of free standing contacts for mounting on a first board along a line to form an elongated slot-like opening for receiving the edge of a second board and for making a series of electrical contacts therewith, with each contact comprising:

a U-shaped portion having a first leg portion, a second leg portion, and a transverse portion, with each of said first and second leg portions having major surfaces which face each other and which are substantially parallel with each other;

said first leg portion having its free end bent over and extending down into said U and diagonally towards said second leg portion;

the free end of said second leg portion being bent outwardly from said first leg to provide a flared opening for said second board;

sections of the edges of said first and second leg portions being bent away from the said facing major surface of said opposite leg to form said legs into elements with at least a portion of their cross-sectional configuration being substantially U-shaped;

a first pair of diagonally positioned bent back edges extending beyond said transverse portion and configured to mate with receiving apertures prepared therefor in said first board;

a second pair of diagonally positioned bent-back edges terminating upon said first board;

at least one edge of the bent over free end of said first leg portion being bent back and away from the facing surface of said opposite leg.

* * * * *